United States Patent
Manganaro

(10) Patent No.: US 7,324,034 B2
(45) Date of Patent: Jan. 29, 2008

(54) METHODS AND APPARATUS TO BALANCE REFERENCE SETTLING IN SWITCHED-CAPACITOR PIPELINED DIGITAL TO ANALOG CONVERTER

(75) Inventor: Gabriele Manganaro, Boxborough, MA (US)

(73) Assignee: Edgewater Computer Systems, Inc., Ottawa (CA)

( * ) Notice: Subject to any disclaimer, the term of this patent is extended or adjusted under 35 U.S.C. 154(b) by 0 days.

(21) Appl. No.: 10/947,646

(22) Filed: Sep. 22, 2004

(65) Prior Publication Data

US 2005/0073452 A1   Apr. 7, 2005

Related U.S. Application Data

(63) Continuation of application No. 10/826,155, filed on Apr. 16, 2004, now abandoned.

(60) Provisional application No. 60/464,387, filed on Apr. 18, 2003.

(51) Int. Cl.
    *H03M 1/66*    (2006.01)
(52) U.S. Cl. .................. 341/150; 341/136; 341/144; 341/172
(58) Field of Classification Search ............... 341/144, 341/150, 172, 135, 136
See application file for complete search history.

(56) References Cited

U.S. PATENT DOCUMENTS

| | | | | |
|---|---|---|---|---|
| 4,072,938 A | * | 2/1978 | Buchanan | 341/172 |
| 4,213,120 A | * | 7/1980 | Buchanan | 341/150 |
| 4,568,917 A | * | 2/1986 | McKenzie et al. | 341/150 |
| 4,584,568 A | * | 4/1986 | Zomorrodi | 341/150 |
| 4,713,650 A | * | 12/1987 | Temes et al. | 341/133 |
| 4,872,011 A | * | 10/1989 | Pelgrom et al. | 341/150 |
| 4,905,006 A | * | 2/1990 | Pelgrom | 341/150 |
| 5,568,145 A | | 10/1996 | Reynolds | |
| 5,625,360 A | * | 4/1997 | Garrity et al. | 341/144 |
| 5,781,140 A | | 7/1998 | Kao | |
| 6,100,830 A | * | 8/2000 | Dedic | 341/136 |
| 6,420,988 B1 | * | 7/2002 | Azami et al. | 341/144 |
| 6,424,283 B2 | | 7/2002 | Bugeja et al. | |
| 6,448,917 B1 | | 9/2002 | Leung et al. | |
| 6,559,784 B1 | * | 5/2003 | Schofield et al. | 341/144 |
| 6,621,432 B1 | * | 9/2003 | Ganci | 341/136 |
| 6,621,439 B1 | | 9/2003 | Bugeja | |
| 6,650,265 B1 | | 11/2003 | Bugeja | |
| 6,741,195 B1 | | 5/2004 | Cho | |
| 2002/0060636 A1 | * | 5/2002 | Kazuhiro et al. | 341/150 |
| 2004/0036642 A1 | | 2/2004 | Eloranta | |

* cited by examiner

*Primary Examiner*—Khai M. Nguyen
(74) *Attorney, Agent, or Firm*—Hamilton, Brook, Smith & Reynolds, P.C.

(57) ABSTRACT

The linearity of switched-capacitor, pipeline digital to analog converters is improved by balancing the settling behavior of its pre-charge switches. In more detail, a switched capacitor DAC includes a number of substantially identical cells, one cell for each bit of an input digital word. A number of switch driver circuits are used to apply respective switch control signals to turn respective switches on and off. Advantageously, the switch control signals differ by an amount determined to equalize the gate-to-source voltage difference between different switches.

18 Claims, 9 Drawing Sheets

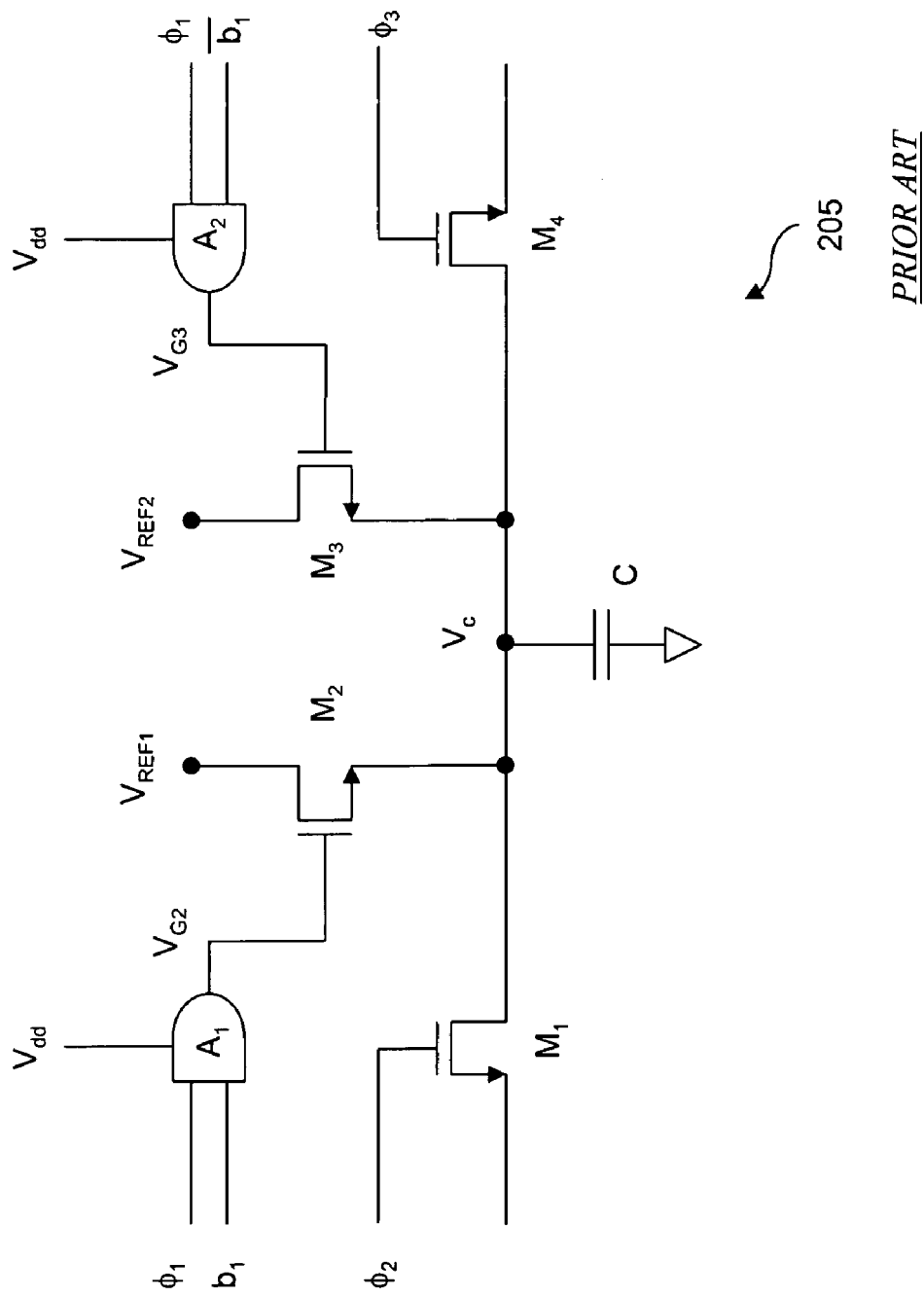
*FIGURE 2A*     *PRIOR ART*

US 7,324,034 B2

METHODS AND APPARATUS TO BALANCE REFERENCE SETTLING IN SWITCHED-CAPACITOR PIPELINED DIGITAL TO ANALOG CONVERTER

RELATED APPLICATION

This application is a continuation of U.S. patent application Ser. No. 10/826,155, filed Apr. 16, 2004 now abandoned, which claims the benefit of U.S. Provisional Patent Application No. 60/464,387, filed Apr. 18, 2003. The entire teachings of the above application are incorporated herein by reference.

BACKGROUND OF THE INVENTION

As progress in Digital-to-Analog Converter (DACs) technology continues to yield devices capable of operating at greater and greater conversion rates, they are capable of supporting an increasing number of applications. For example, very high-speed DACs enable digital processing in applications that had once been limited to the analog domain. Such applications include wired and wireless communication systems. See for example, A. Rofougaran et al., "A single-chip 900-MHz Spread-Spectrum Wireless Transceiver in 1-μm CMOS—Part I: Architecture and Transmitter Design," IEEE Int. J. of Solid-State Circuits, vol. 33, no. 4, April 1998, incorporated herein by reference in its entirety. These new applications often demand greater control of harmonic distortion and limitations in power consumption.

One emerging DAC architecture is a pipeline, switched-capacitor DAC as described in "A Quasi-Passive CMOS Pipeline D/A Converter," by F. J. Wang, G. C. Temes, S. Law, published in the IEEE Int. J. of Solid-State Circuits, vol. 24, no. 6, December 1989, (the "Wang" reference) incorporated herein by reference in its entirety. An attractive characteristic of this architecture is that it intrinsically does not suffer from major output glitches, which are a common source of distortion in DACs. On the other hand, current implementations are affected by a number of other circuit shortcomings that limit the practically achievable dynamic linearity.

A conventional switched-capacitor, pipeline DAC is composed by cascading a number of substantially identical cells that cooperatively synthesize an analog representation of a digital quantity by a charge-sharing algorithm driven by input digital data. Each cell includes a storage capacitor and is uniquely associated to a respective bit of the digital input. The capacitor is used to store an intermediate result of the data conversion and further as a processing element for the conversion algorithm. In more detail, each capacitor in the pipeline of cells is pre-charged to one of two different reference voltage levels depending on the logic state of the bit associated with the cell. This type of switched-capacitor DAC is discussed in more detail below.

At least one problem with this approach relates to the settling behavior of the capacitors' pre-charge process. Namely, the settling behavior depends on the digital code to be converted. Thus, the settling behavior for a cell associated with a logical "1" input will be different than the settling behavior of the same cell associated with a logical "0." This result is referred to as a "code dependence" that leads to a degradation in the linearity of the DAC. Further complicating matters, the source circuit providing the reference voltage levels is also disturbed by the pre-charge process. This disturbance is also code-dependent and further limits linearity.

SUMMARY OF THE INVENTION

As described in more detail below, the settling behavior relates, at least in part, on the gate-to-source voltage differences between the different cells of the DAC. That is, the different reference voltages applied to each cell as a result of an input digital word, can lead to differences in settling behavior. The present invention solves the problems of the prior art switched-capacitor DACs by providing a cost-effective and efficient architecture and process that significantly reduces code-dependency on the pre-charge process and on the reference settling behavior. A switch driver circuit is used to generate switch control signals that differ by an amount determined to equalize the gate-to-source voltage difference between different switches.

In one aspect, the invention relates to a switched-capacitor digital-to-analog converter (DAC) including a number of cells, with each cell including first and second switches. The first and second switches switch respective voltages from a source to a charged capacitor. The DAC includes respective switch driver circuits, each in electrical communication with a respective one of the first and second switches. Each of the switch driver circuits applies a switch control signal to a respective one of the first and second switches. The switch control signals that turn the switch on differ to equalize the gate-to-source voltage difference.

The first and second switches can be transistor switches, such as metal-oxide-semiconductor (MOS) devices. Thus, the switch control signal can be a gate voltage controlling a MOS transistor between switching states.

In some embodiments, each respective switch driver circuit includes a first element receiving an external input, the first element providing an output responsive to the received input. Each respective switch driver circuit also includes a second element in electrical communication with the first element. The second element receives the output and conditions the output according to the difference between the respective voltages from the source.

The first element can be a logic gate, such as a NAND gate, receiving one bit of a digital input word and a switching control signal according to the value of the received bit. The switching control signal, in turn, can be a clock signal. The second element can also be a logic device, such as an inverter, powered by a logic source having a source level depending on the difference between the respective voltages from the source.

Still further, the source can include two emitter-follower circuits and a resistor network, each coupled between electrical power and ground. The emitter-follower circuits can include bipolar junction transistor devices.

In another aspect, the invention relates to a process for data conversion using a switched-capacitor DAC including the step of providing a plurality of cells, including first and second switches. The switches switch respective different voltages from a source to a charged capacitor. The process also includes providing respective switch driver circuits, each in electrical communication with a respective one of the first and second switches. The switch driver circuits apply respective switch control signals to respective ones of the first and second switches. In particular, the switch control signals that turn the switch on are different to equalize the gate-to-source voltage difference.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2A is a more detailed schematic diagram of a single-ended embodiment of a representative cell of a switched-capacitor, pipeline DAC;

DETAILED DESCRIPTION OF THE INVENTION

A description of preferred embodiments of the invention follows.

Disclosed herein is a method and apparatus to improve the linearity of pipelined switched-capacitor digital to analog converters by balancing the settling behavior of its precharge switches. A switched-capacitor, pipeline DAC includes a number of substantially identical cells, one cell for each bit of an input digital word. The DAC converts the input digital word to an analog output signal using a number of switch driver circuits to apply respective switch control signals that turn respective switches on and off among the different cells. Advantageously, the switch control signals differ by an amount determined to equalize any gate-to-source voltage differences between the different switches. Equalizing the gate-to-source voltage differences improves the settling behavior of the different cells, thereby improving the overall linearity of the DAC.

It is assumed herein that the digital input of the DAC is represented by a set of N bits $\{b_0\ b_1\ b_2\ \ldots\ b_{N-1}\}$, where $b_0$ represents the least significant bit (LSB) and $b_{N-1}$ represents the most significant bit (MSB). It is further assumed herein that the power supply voltage of all the logic gates is $V_{dd}$ unless differently specified. Also, $V_{REF1}$ and $V_{REF2}$ represent two reference (DC) voltage levels.

Figure 1A:
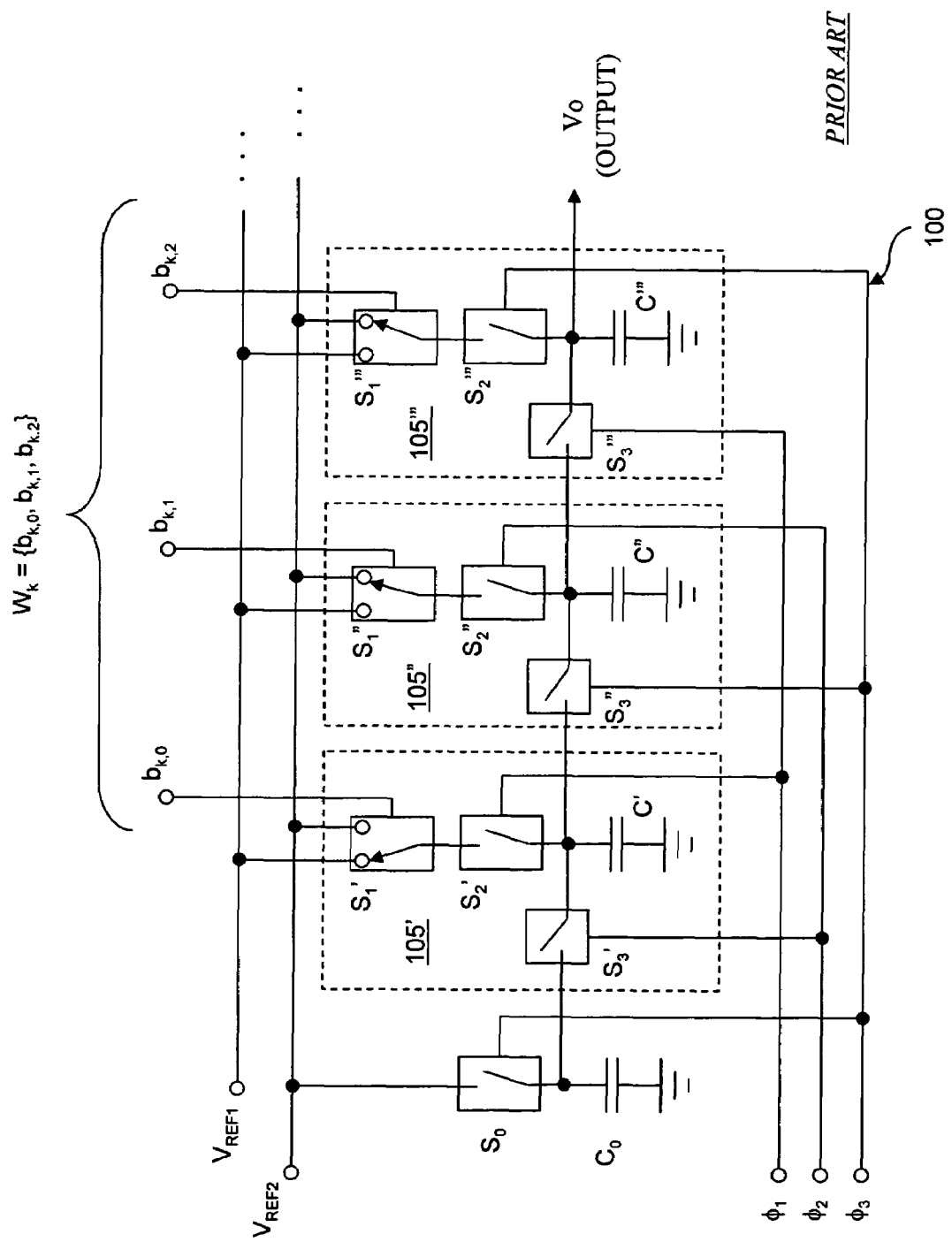
FIG. 1A is a schematic diagram of a switched-capacitor, pipeline Digital-to-Analog Converter (DAC)

The DAC 100 receives an input digital word $W_k$ and converts it to a corresponding output signal $V_o$. As shown in FIG. 1A, one embodiment of a switched-capacitor, pipeline DAC 100 is essentially composed of a cascade of identical cells 105', 105'', 105''' (generally 105), one cell for each bit $b_i$ of the digital input word. Thus, for an i-bit digital word, $W_k = \{b_{k,1},\ b_{k,2},\ \ldots\ b_{k,1}\}$, the DAC 100 includes i identical cells 105.

Each cell 105 is coupled to two different source levels referred to generally as $V_{REF1}$ and $V_{REF2}$. The sources can be different (DC) voltage levels. Either of the source levels can be positive or negative with respect to ground. In fact, one of the source levels can even be at ground potential. The DAC 100 also receives a switch control signal. For example, the switch-control signal can be provided by a multi-phase clock, such as the 3-phase clock $\{\phi_1\ \phi_2\ \phi_3\}$ shown in FIG. 1B. Thus, as illustrated, three phases of the input clock occur during each occurrence of a digital input word $W_k$. In this manner, the multi-phase clock sets the basic timing for DAC operation.

In more detail, each of the cells 105 includes a respective storage capacitor C. Each of the cells 105 also includes a first switch $S_1$ connected in series through a second switch $S_2$ to a non-reference terminal of the storage capacitor C. A second, reference terminal of the capacitor C is connected to a reference voltage level, such as electrical ground. The first switch $S_1$ is referred to as a "two-way switch" and is controlled by a respective input bit (e.g., $b_i$). For example, the two-way switch $S_1$ connects the cell 105 to $V_{REF1}$ if $b_i$ is 1, and to $V_{REF2}$ if $b_i$ is 0. Thus, the two-way switch $S_1$ functions as a single-pole, double-throw switch. The second switch $S_2$ is referred to as a "sampling switch" and selectively connects one terminal of the first switch $S_1$ to the non-reference terminal of the capacitor C. Once connected, the capacitor C redistributes charge according to its initial stored value and the value of the interconnected source level. Thus, the sampling switch $S_2$ functions as a single-pole-single-throw switch. The sampling switch $S_2$ is controlled by a respective one of the input switch control signals (i.e., a respective phase of the multi-phase input clock: $\phi_1$, $\phi_2$, or $\phi_3$).

Each cell 105 also includes a third switch $S_3$ configured to interconnect the non-reference terminal of the respective capacitor C to one of the adjacent cells 105. In this manner, the cells 105 can be cascaded together to accommodate a digital input word of a predetermined length. The third switch $S_3$ is also controlled by a respective one of the input switch control signals $\phi_1$, $\phi_2$, or $\phi_3$. An initialization capacitor $C_0$ is connected at a first terminal, through an initialization switch $S_0$, to one of the reference levels, e.g., $V_{REF2}$. A second terminal of the initialization capacitor $C_0$ is connected to a reference potential, such as electrical ground. The initialization switch $S_0$ is similarly controlled by a respective one of the input switch control signals $\phi_1$, $\phi_2$, or $\phi_3$. The initialization capacitor $C_0$ precedes the substantially identical cells 105 and is interconnected to the first cell 105' through that cell's third switch $S_3'$.

Figure 1B:
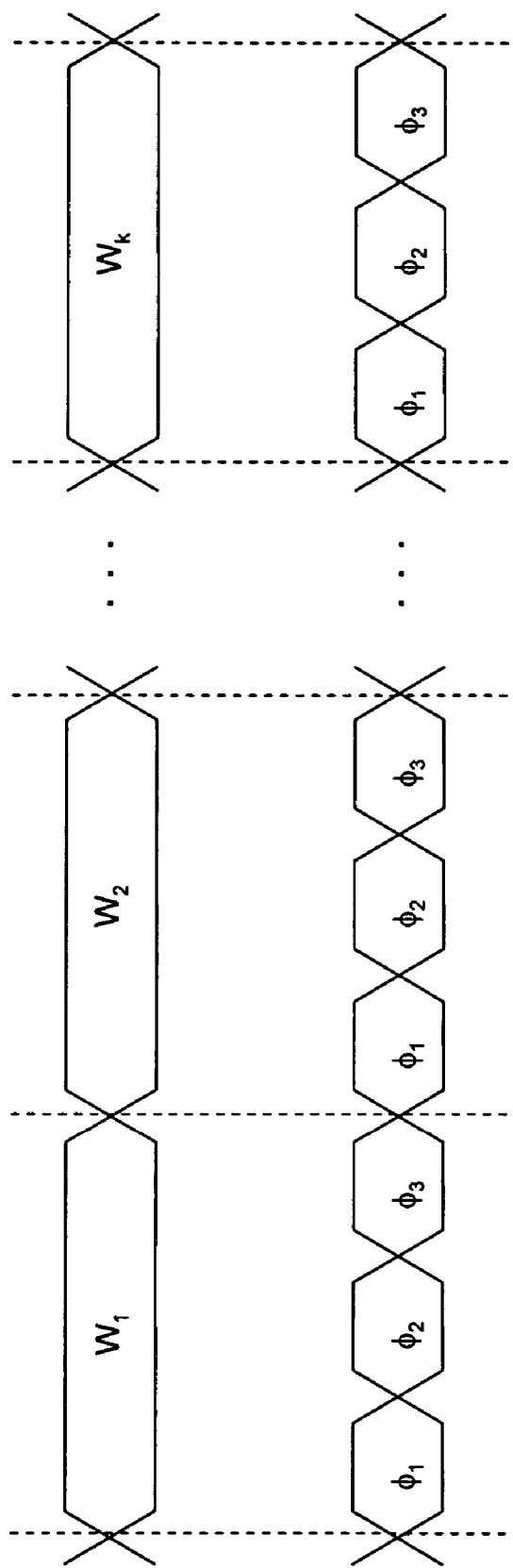
FIG. 1B is a timing diagram associated with the DAC shown in FIG. 1A.

A multi-phase clock sets the basic timing for the DAC operation. Consider the 3-bit DAC 100 shown in FIG. 1A with the basic timing provided by the 3-phase clock $\{\phi_1\ \phi_2\ \phi_3\}$ as shown in FIG. 1B. For illustrative purposes, also consider that the second reference level, $V_{REF2}$, is 0. First, during the time when the first phase $\phi_3$ is high, the initialization capacitor $C_0$ is discharged to ground (i.e., $V_{REF2}=0$ volts) by closing the switch $S_0$. During the next phase of the clock, when $\phi_1$ is high, the capacitor C' of the first cell 105' is charged to a reference voltages $V_{REF1}$, depending upon the value of the respective input bit $b_{k,0}$, by closing the sampling switch $S_2'$. As described above, the applicable reference voltage $V_{REF1}$, 0 is set by the two-way switch $S_1'$, according to its input bit $b_{k,0}$. When the clock phase $\phi_1$ goes low, two-way switch $S_2'$ opens. The voltages across the capacitors C' and $C_0$ are then $V_{REF1}$ and 0, respectively.

Next, clock phase $\phi_2$ goes high and switch $S_3'$ is closed. The charges in the two capacitors C' and $C_0$ will then be redistributed. Simultaneously, capacitor C" is pre-charged either to the reference voltage $V_{REF1}$ or 0 by switch $S_2$" depending on the value of $b_{k,1}$. When the clock phase $\phi_2$ goes low, the voltage across C" and $C_0$ will be $(b_{k,1}/2)V_{REF1}$, and the voltage across C" will be $b_{k,2}V_{REF1}$. When the clock phase $\phi_3$ goes high, switch $S_3$" is closed, and charges in capacitors C" and C' will be redistributed. Simultaneously, capacitor C'" is pre-charged in the same fashion as C" and C' were. When the clock signal $\phi_3$ goes low, the voltages across capacitors C" and C' equal $(b_{k,2}+2^{-1}b_{k,1})V_{REF1}/2$ and the voltage across the C'" is $b_{k,3}V_{REF1}$.

In the next clock cycle when the clock phase $\phi_1$ goes high, the capacitor C' is pre-charged according to bit $b_{k+1,1}$ of the next digital word, etc. At the end of $\phi_1$ the voltage across capacitor C'" is $(b_{k,3}+2^{-1}b_{k,2}+2^{-2}b_{k,1})V_{REF1}/2$. So, after one full cloc DAC 100 is ready to sample the next digital word and the analog voltage corresponding to the current digital word is available at the capacitor C'" (i.e., output signal $V_O$). An exemplary switched capacitor DAC is also described in more detail in the Wang reference, and in K. Khanoyan et al., "A 10b, 400 MS/s glitch-free CMOS D/A converter," Proc. of IEEE 1999 Symp. on VLSI Circuits, pp. 73–76, 1999 (the "Khanoyan et al." reference), each respectively incorporated herein by reference in its entirety.

Figure 2B:
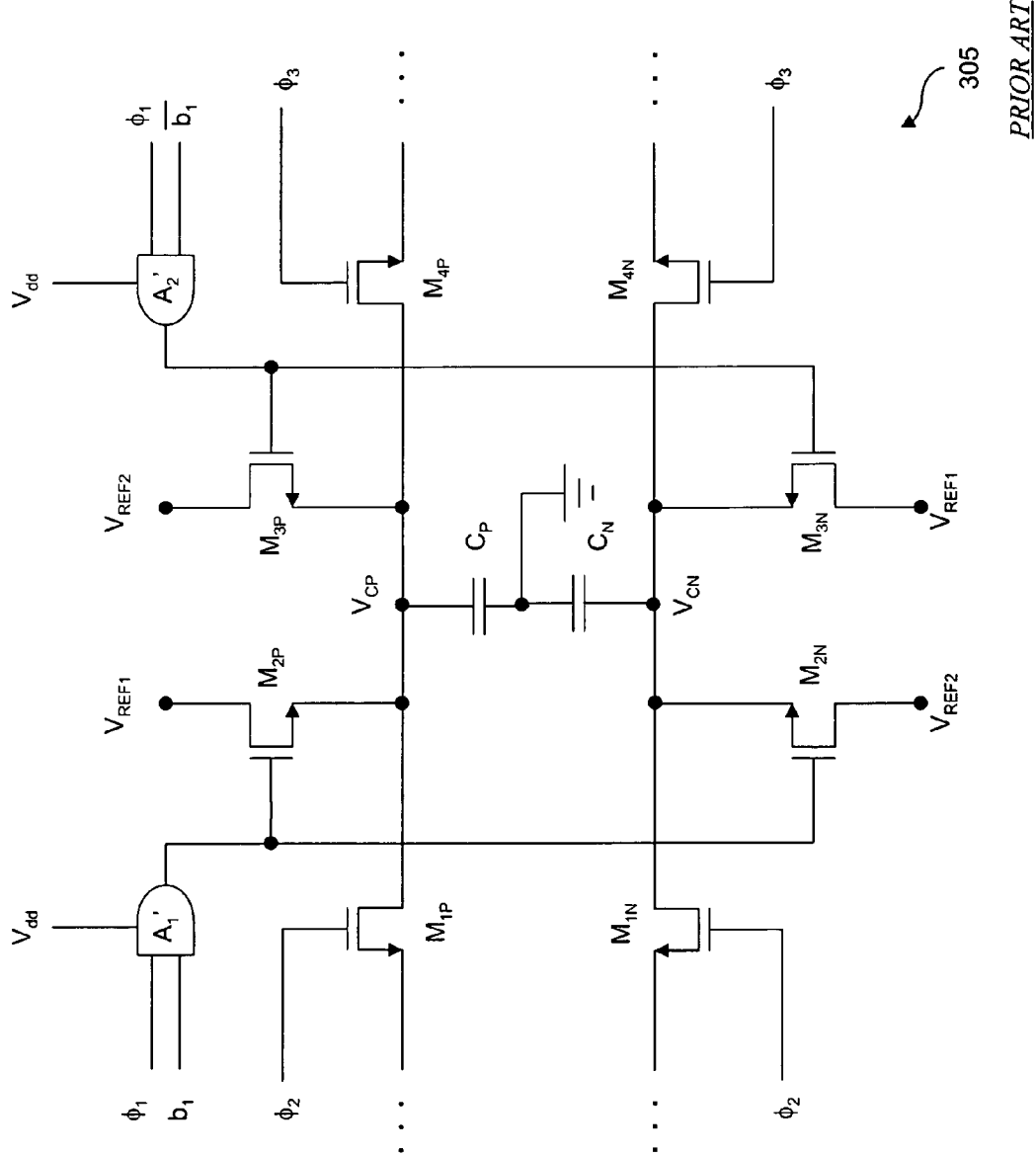
FIG. 2B is a more detailed schematic diagram of a differential embodiment of a representative cell of a switched-capacitor, pipeline DAC.

One embodiment of an exemplary cell (e.g., cell 105'" receiving $b_2$) is shown in more detail in FIG. 2A. In this embodiment, the switches $S_1$, $S_2$, and $S_3$ have been implemented using a combination of transistors and logic gates. Here, the series combination of the two-way switch $S_1$ controlled by bit $b_1$ and the sampling switch $S_2$ controlled by switch-control signal $\phi_1$ has been implemented using two transistor switches $M_2$ and $M_3$ controlled by proper logic combinations of $b_1$ and $\phi_1$. For example, each of the transistor switches $M_2$ and $M_3$ can be controlled by a respective switch driver circuit including two-input AND gates $A_1$ and $A_2$.

To provide the proper control, a first AND gate $A_1$ receives as inputs one phase of the input clock (e.g., $\phi_1$) and the respective input bit (e.g., $b_1$). Thus, when the input clock is high and the respective input bit is 1, the output of the AND gate $A_1$ (i.e., $V_{G2}$) is high, turning the second interconnected transistor switch $M_2$ on (i.e., conducting). Similarly, a second AND gates $A_2$ receives as inputs the same phase of the input clock and an inverted value of respective input bit (e.g., $NOT(b_1)$). Thus, when the input clock is high and the respective input bit is 1, the output of the AND gate $A_1$ (i.e., $V_{G3}$) is low, leaving the third interconnected transistor switch $M_3$ in an off state (i.e., nonconducting).

In operation, on the first phase $\phi_1$ of the input clock, the capacitor C is connected to one of the two reference voltages $V_{REF1}$ or $V_{REF2}$ depending on the logic state of $b_1$. Specifically, $M_2$ will be turned on (and $M_3$ will be turned off) if $b_1=1$; conversely, $M_3$ will be turned on (and $M_2$ will be turned off) if $b_1=0$.

The first transistor switch $M_1$ corresponds to the third switch $S_3$ of FIG. 1A; whereas, the fourth transistor switch $M_4$ corresponds to a third switch (i.e., $S_3$) of an adjacent cell. As illustrated, the transistor switches $M_1$, $M_2$, $M_3$, and $M_4$ can be Metal-Oxide-Semiconductor, Field-Effect-Transistor (MOSFET) devices. In another embodiment, shown in FIG. 2B, a cell can be configured as a pseudo-differential implementation. The pseudo-differential implementation includes a positive half-circuit and a negative half-circuit, each half-circuit conducting through a respective capacitor $C_P$, $C_N$ to ground. Both halves of the circuit are controlled by the same switch driver circuit (e.g., AND gates $A_1$ and $A_2$), but the corresponding switches connect to different reference levels. That is, a first switch $M_{2P}$ on the positive half-circuit is coupled to $V_{REF1}$; whereas, its corresponding switch $M_{2N}$ on the negative half-circuit is coupled to $V_{REF2}$.

It is important, at this point, to observe that the time-constant for the settling of the voltage across the capacitor C toward its steady-state value $V_{REF1}$ or $V_{REF2}$ will depend on the value of $b_1$. To understand this, it will just suffice to notice that the on-resistance of the switches $M_2$ and $M_3$ are inversely proportional to the voltage differences ($V_{G2}-V_{REF1}$) and ($V_{G3}-V_{ref2}$) respectively; $V_{G2}$ (respectively $V_{G3}$) will be equal to the power supply voltage $V_{dd}$ if $b_1=1$ (respectively $b_1=0$) and equal to the ground voltage if $b_1=0$ (respectively $b_1=1$). A similar observation can be made for the pseudo-differential implementation shown in FIG. 2B.

It may be worth noticing that, if we assume $V_{REF1} > V_{REF2}$, then the on-resistance of $M_3$ will be smaller than the on-resistance of $M_2$. Consequently, $M_2$ having a larger on-resistance value will determine the slowest settling and, hence, limit the speed at which the pre-charge can be accomplished. Incomplete settling will introduce a code-dependent error, hence harmonic distortion on the DAC's output.

Moreover, when $M_2$ (respectively $M_3$) is switched-off, right after the pre-charge to $V_{REF1}$ (respectively $V_{REF2}$) is completed, a charge which is function of $V_{dd}-V_{REF1}$ (respectively $V_{dd}-V_{REF2}$) will be injected by this MOSFET into the capacitor C. The charge injected depends on the logic state of $b_1$ as it is function of ($V_{G2}-V_{REF1}$) and ($V_{G3}-V_{REF2}$) as well. In an actual circuit, the difference in settling behavior will not only be limited to the different time constants, as just explained, but the entire behavior of the settling will be affected. For example, parasitic effects associated with a physical realization of the DAC can lead to oscillations, or ringing during settling.

Figure 3:
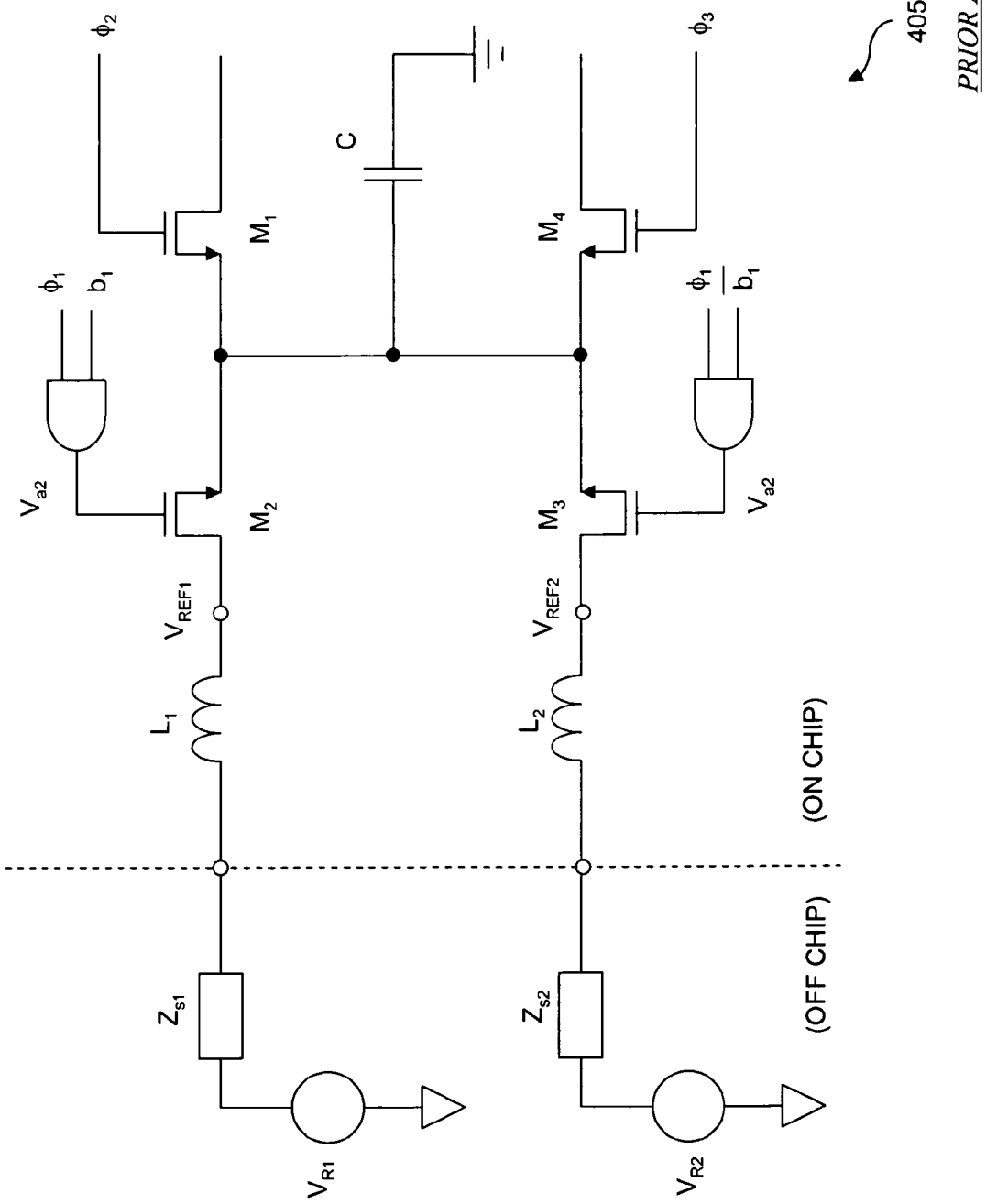
FIG. 3 is a more detailed schematic diagram of the source interconnection to a representative cell of a switched-capacitor, pipeline DAC.

Referring now to the circuit shown in FIG. 3, a model of a "real" reference circuit has been added to the cell of FIG. 2A. Specifically, the reference source $V_{REF1}$ (respectively $V_{REF2}$) is generated by a reference circuit that can be represented or modeled as a source voltage $V_{R1}$ and a corresponding source impedance $Z_{S1}$ (respectively $V_{R2}$ and $Z_{S2}$). Such a reference $V_{R1}$, $Z_{S1}$ can be provided by an external circuit which (e.g., external to the chip integrating the DAC 100). Alternatively, the reference circuit can be integrated on the same die containing the DAC 100, but it may need to be connected to the DAC 100 through an off-chip connection to allow for external capacitive decoupling. In either of these cases, the actual connection between the reference sources and the DAC's cells 105 will encounter a non-negligible, parasitic effect. Typically, the parasitic effects are due to inductance resulting from the lengths of conductor used. Here the parasitic effects are modeled by the two inductors $L_1$ and $L_2$; however, the parasitic effects could also include capacitance and/or resistance.

The circuit composed by $V_{R1}$, $Z_{S1}$, $L_1$, $M_2$ and C (respectively $V_{R2}$, $Z_{S2}$, $L_2$, $M_3$ and C) constitutes a well-known resistive-inductive-capacitive (RLC) network which can have very different settling behavior depending on the values of its components. A reasonable package design will try to equalize the inductance values, making $L_1=L_2$. However, as described above, the respective on-resistance values of $M_2$ and $M_3$ will differ. Hence, the damping of $V_{REF1}$ and $V_{REF2}$ will always be different.

In principle, it is possible to compensate for this difference by properly setting the references' source impedances $Z_{S1}$ and $Z_{S2}$ (for example, by setting $Z_{S1}$ to the on-resistance of $M_3$ and by setting $Z_{S2}$ to the on-resistance of $M_2$). Such an approach, however, would not be very practical to accurately realize. Moreover it would double the total series resistance of the pre-charge circuit, thereby significantly degrading the speed of the DAC 100.

Thus, because of the intrinsic code-dependence of the on-resistance of the pre-charge switches, the corresponding settling is affected and can result in harmonic distortion of the digital to analog conversion. Moreover, because of the different steady-state value of the gate-source voltages of the same pre-charge switches, the charge injected on to the capacitors C once the switches open, will depend to the code as well. Ideally, this last effect should only result in gain error instead of harmonic distortion (as described in either the Wang reference or the Khanoyan et al. reference). In reality, actual mismatches between the cells composing the array introduce different gain errors for different cells, and hence will contribute to harmonic distortion and code-dependency as each cell corresponds to a different bit.

Figure 4A:
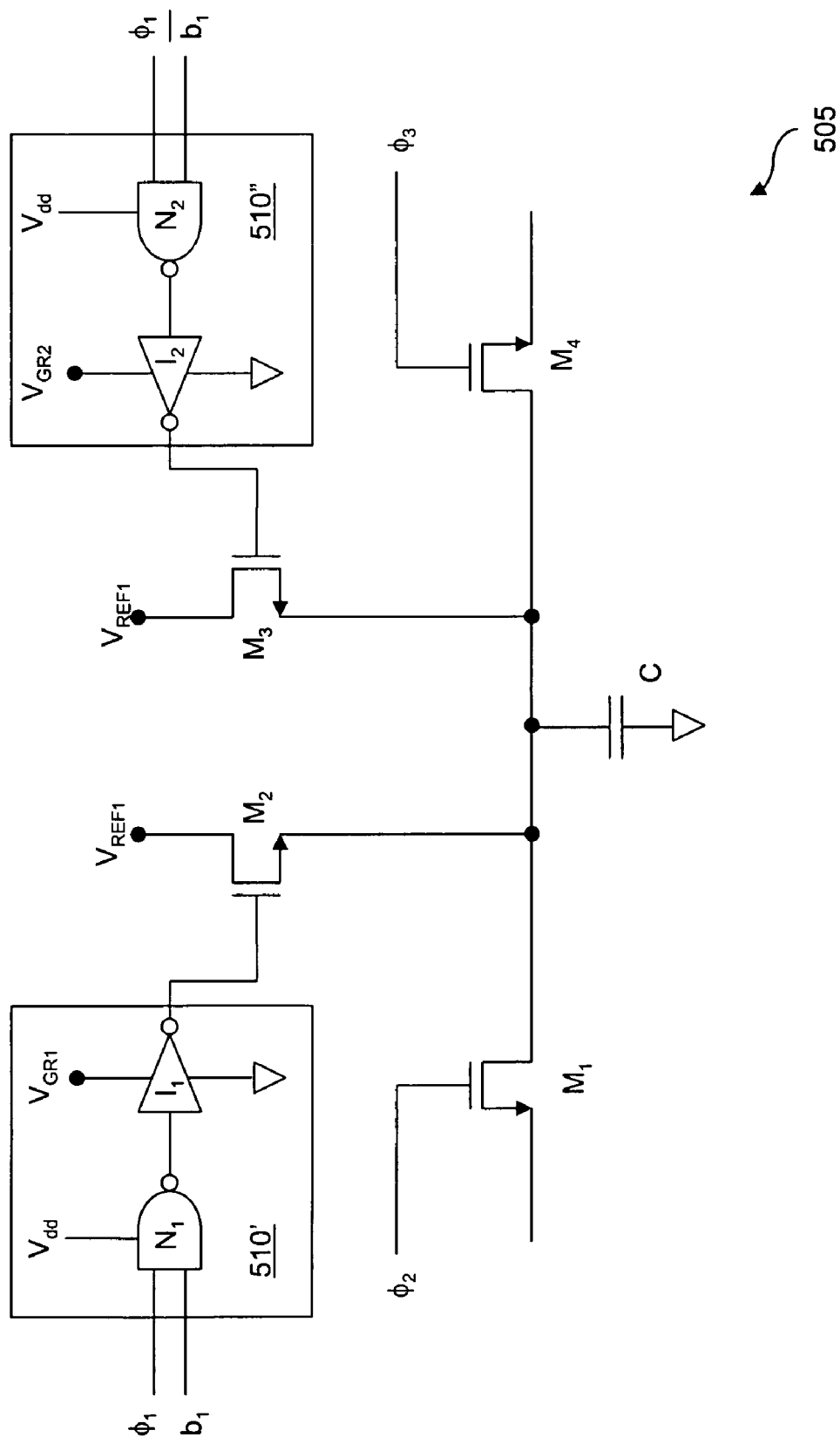
FIG. 4A is a more detailed schematic diagram of one embodiment of a compensating switch driver used in a representative cell of a single-ended switched-capacitor, pipeline DAC.

An embodiment of the switch driver circuit that significantly improves the above-mentioned problems is shown in FIG. 4A in its single-ended form. This circuit differs from the one shown in FIG. 2A in that each of the AND gates $A_1$ and $A_2$ has been replaced by a respective NAND gate $N_1$, $N_2$ and inverter $I_1$, $I_2$. The output of the NAND gate $N_1$, $N_2$ is coupled to its respective transistor $M_2$, $M_3$ through a respective inverter $I_1$, $I_2$. It is important to note that power supply connected to each of the inverters $I_1$, $I_2$ is set to a respective voltage level $V_{GR1}$, $V_{GR2}$ rather than $V_{dd}$. Because of this, the output voltage of the inverter $I_1$ (respectively $I_2$) will be equal to $V_{GR1}$ (respectively $V_{GR2}$) when its input is a logic zero; conversely, it will be equal to the ground voltage when its input is a logic one.

The particular inverter power supply values $V_{GR1}$ and $V_{GR2}$ are chosen such that the following equality is maintained: $V_{GR1}-V_{REF1}=V_{GR2}-V_{REF2}$. By doing so, the on-resistance of each of the switching transistors $M_2$, $M_3$ is now independent from $V_{REF1}$ and $V_{REF2}$. Consequently, the on-resistance is also independent from the logic state of $b_1$. Some exemplary circuits configured to maintain the equality $V_{GR1}-V_{REF1}=V_{GR2}-V_{REF2}$ are discussed below.

By satisfying this equality, all the issues mentioned above are resolved. Namely, the settling behavior of $M_2$ and $M_3$ is the same and no longer depends on the state of the input bit (e.g., $b_1$). Because of that, to a first order, incomplete settling behavior is no longer code-dependent and thus does not introduce harmonic distortion.

Further, it is possible to reduce the size of the transistor switches $M_2$ and $M_3$, yielding several additional benefits to the performance of the DAC. These benefits include: (i) requiring a smaller charge injection from $M_2$ and $M_3$, thereby directly improving the linearity of the DAC; (ii) reducing the values of the parasitic capacitors—in particular, reducing the drain-bulk and source-bulk junction (nonlinear) capacitors, thereby directly improving the linearity of the DAC. It is then possible to similarly reduce the size of the inverters $I_1$ and $I_2$ (and, possibly the NAND gates $N_1$ and $N_2$) with further advantage in terms of reduction in area and power consumption. Furthermore, the charge injected into the capacitor C when either $M_2$ or $M_3$ turn off, is now code-independent as well.

In reality, the dependence on $V_{REF1}$ and $V_{REF2}$ (and, hence, on the digital input $b_1$) may not be entirely removed as the threshold voltages of $M_2$ and $M_3$ depend on their bulk-source voltages $V_{bs2}$ and $V_{bs3}$. However, using a suitable technology to integrate the DAC 100 can allow for short-circuiting the bulk and source terminals of both $M_2$ and $M_3$. In doing this, the values of the bulk-source voltages are set to the ground potential (i.e., $V_{bs2}=V_{bs3}=0$) and the code-dependence is entirely removed. This is possible, for example, using technologies that allow for separate wells for $M_2$ and $M_3$. Some examples of suitable technologies include IBM's CMOS 0.25 u and 0.18 u technologies, respectively known as CMOS 6SF and 7SF. In particular, these technologies include so-called triple-well NMOS devices, which allow for short-circuiting the bulk and source terminals.

In some embodiments, the switches $M_2$, $M_3$ are implemented using single PMOS transistors instead of single NMOS transistors as described above. By using PMOS transistors and respectively fabricating each switch $M_2$, $M_3$ on an individual N-well, any modern so-called CMOS P-type substrate technology (i.e. the vast majority of currently used technologies) would allow for short-circuiting the bulk and source terminals.

Conversely, if it is not possible to set the bulk-source voltages to the ground potential and the bulk terminals are connected to ground, then $V_{bs2}=V_{REF1}$ and $V_{bs3}=V_{REF2}$. In this latter case, there will still be some residual code-dependence through the well-known "bulk-effect." However, the invention still provides a considerable improvement over the prior art as the major contribution to the code-dependence has been cancelled.

Figure 4B:
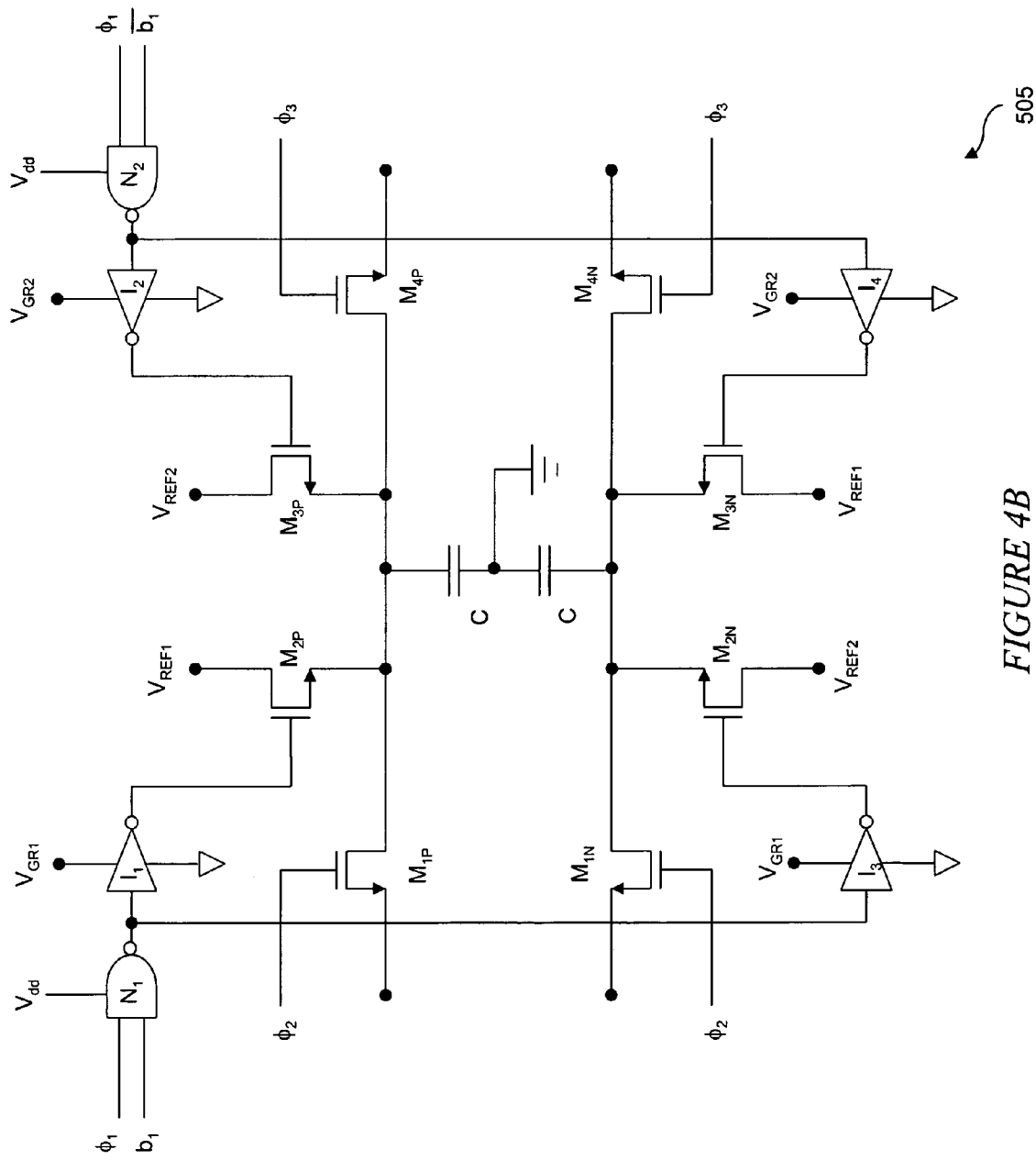
FIG. 4B is a more detailed schematic diagram of an alternative embodiment of a compensating switch driver used in a representative cell of a differential switched-capacitor, pipeline DAC.

A pseudo-differential version of the implementation of FIG. 4A is shown in FIG. 4B. It will be apparent to those skilled in the art that another version of the circuits of FIGS. 4A and 4B using PMOS switches (or CMOS transmission gates) in place of the NMOS switches can be easily implemented without departing from the spirit of this invention.

In a further modification to the preferred embodiment, if $V_{REF1}>V_{REF2}$ then the value of $V_{GR1}$ can be set such that $V_{GR1}=V_{dd}$, and the value of $V_{GR2}$ can be set such that $V_{GR2}=V_{dd}-V_{REF1}+V_{REF2}$. This choice for $V_{GR1}$ and $V_{GR2}$ satisfies the above condition $V_{GR1}-V_{REF1}=V_{GR2}-V_{REF2}$ and offers two main advantages. Namely, the settling time for the pre-charge process is the fastest possible, and the implementation of the source for $V_{GR1}$ is trivial as it is possible to use the power supply $V_{dd}$ itself.

Figure 5B:
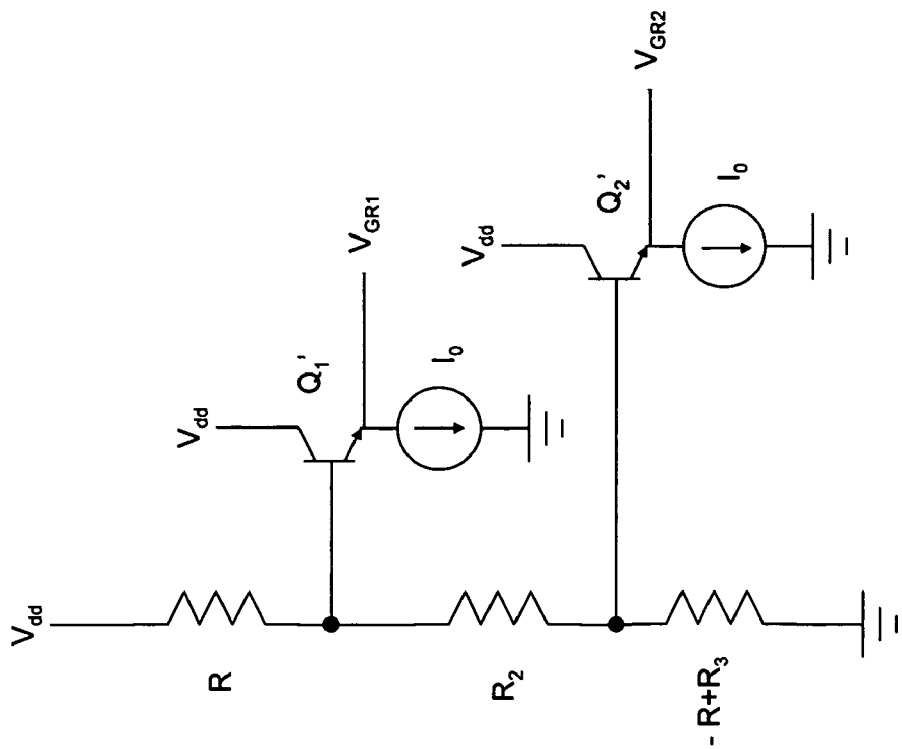
FIGS. 5A and 5B are schematic diagrams of one embodiment of a transistor-based source-interconnect circuits.
Figure 5A:
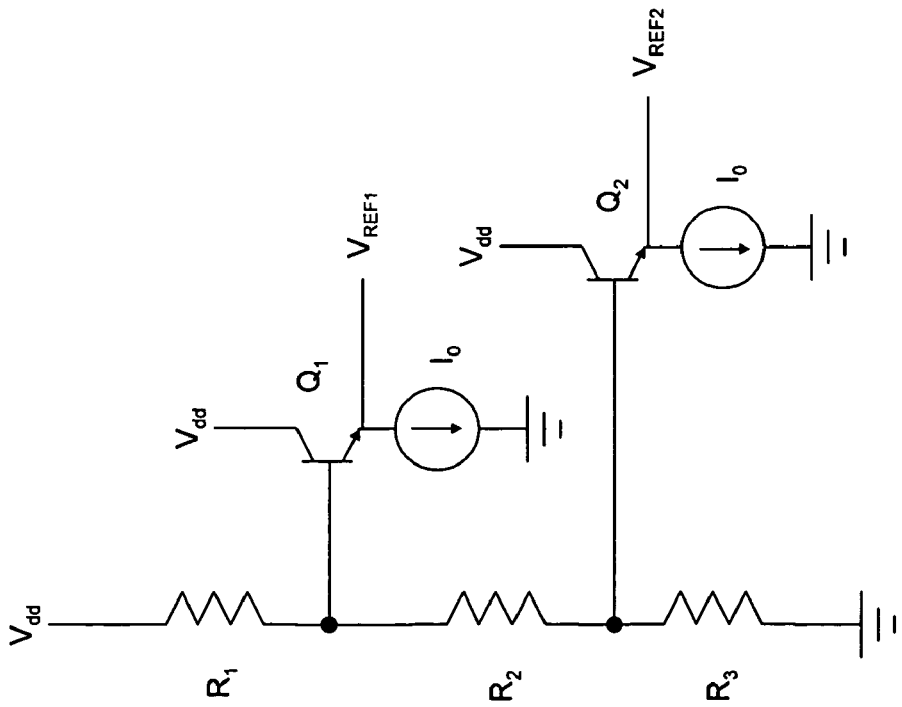

The circuits shown in FIGS. 5A and 5B respectively represent exemplary embodiment of the reference voltage generators $V_{REF1}$ and $V_{REF2}$ and the voltage sources $V_{GR1}$ and $V_{GR2}$. In particular, the relative component values shown are selected to satisfy the condition $V_{GR1}-V_{REF1}=V_{GR2}-V_{REF2}$. Referring to FIG. 5A, the first reference voltage generator $V_{REF1}$ is formed using a first bipolar junction transistor $Q_1$ configured as an emitter-follower. The base of transistor $Q_1$ is connected to the voltage source $V_{dd}$ through a first resistor $R_1$ and to ground through the resistor combination $R_2+R_3$. Similarly, the second reference voltage generator $V_{REF2}$ is also formed using a second bipolar junction transistor $Q_2$ also configured as an emitter-follower. The base of transistor $Q_2$ is connected to the voltage source $V_{dd}$ through a resistor combination $R_1+R_2$ and to ground through the resistor $R_3$.

Referring to FIG. 5B, the first inverter voltage generator $V_{GR1}$ is formed using a first bipolar junction transistor $Q_1'$ configured as an emitter-follower. The base of transistor $Q_1'$ is connected to the voltage source $V_{dd}$ through a first resistor R and to ground through the resistor combination $R_2+(R_1-R+R_3)$. Similarly, the second inverter voltage generator $V_{GR2}$ is also formed using a second bipolar junction transistor $Q_2'$ also configured as an emitter-follower. The base of transistor $Q_2'$ is connected to the voltage source $V_{dd}$ through a resistor combination $R+R_2$ and to ground through the resistor value $(R_1-R+R_3)$. Those skilled in the art will recognize that the implementation of the voltage sources for $V_{GR1}$ and $V_{GR2}$ can be obtained in several different ways.

Thus, assuming that the base currents of the bipolar transistors $Q_1$, $Q_2$, $Q_1'$, $Q_2'$ of both circuits are negligible with respect to $V_{dd}/(R_1+R_2+R_3)$, it can be easily proved that $V_{GR1}$ and $V_{GR2}$ satisfy the required condition $V_{GR1}-V_{REF1}=V_{GR2}-V_{REF2}$.

Figure 6B:
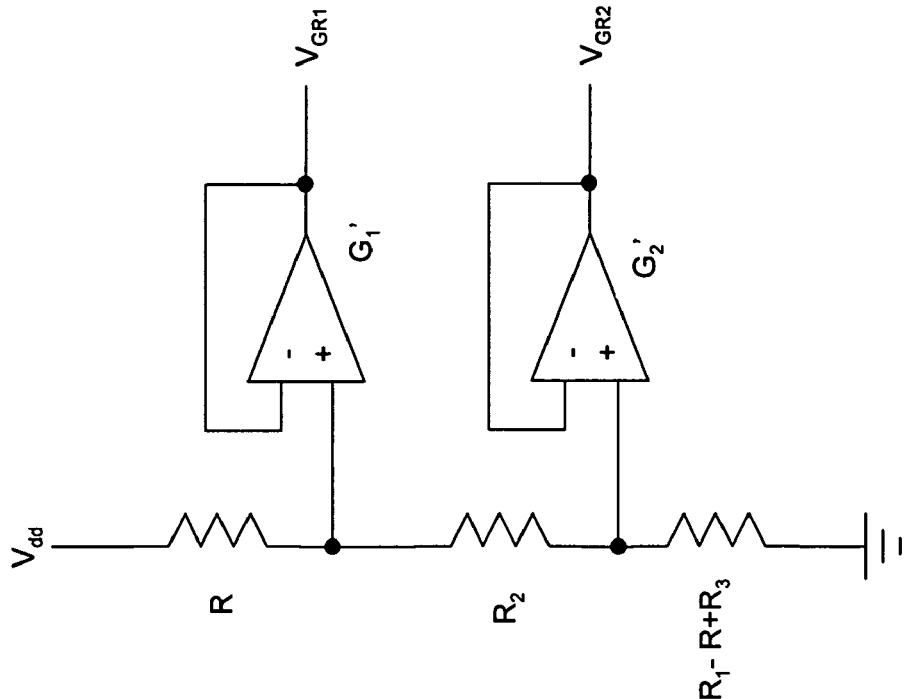
FIGS. 6A and 6B are schematic diagrams of an alternative embodiment of a buffer-based source-interconnect circuit.
Figure 6A:
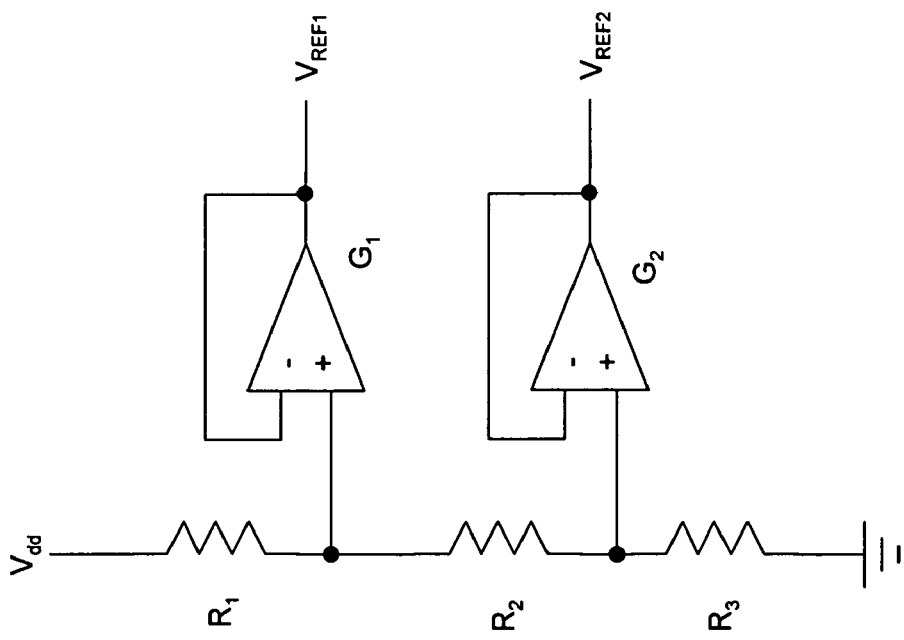

The circuits shown in FIGS. 6A and 6B respectively represent an alternative embodiment of the reference voltage generators $V_{REF1}$ and $V_{REF2}$ and the voltage sources $V_{GR1}$ and $V_{GR2}$ using unity-gain buffer amplifiers. Here, unity gain buffer amplifiers $G_1$, $G_2$, $G_1'$, and $G_2'$ replace the bipolar junction transistors $Q_1$, $Q_2$, $Q_1'$, and $Q_2'$ of FIGS. 5A and 5B, respectively.

While this invention has been particularly shown and described with reference to preferred embodiments thereof, it will be understood by those skilled in the art that various changes in form and details may be made therein without departing from the scope of the invention encompassed by the appended claims.

What is claimed is:

1. A switched-capacitor digital-to-analog converter comprising:
   a plurality of cells, each cell comprising first and second switches switching respective voltages from a source to a charged capacitor, and
   respective switch driver circuits each in electrical communication with a respective one of the first and second switches, each switch driver circuit applying a switch control signal to the switch, the switch control signals that turn the switches on differing to equalize the on-state gate-to-source voltage differences of the first and second switches, each switch driver circuits comprising:
      a first element receiving an external input, the first element providing an output responsive to the received input; and
      a second element in electrical communication with the first element, the second element receiving the output and conditioning the output according to the difference between the respective voltages from the source.

2. The converter of claim 1, wherein the first element is a logic gate receiving one bit of a digital input word and a switching control signal.

3. The converter of claim 2, wherein the logic gate is a NAND gate.

4. The converter of claim 2, wherein the switching control signal is a clock signal.

5. The converter of claim 2, wherein the second element is a logic gate powered by a logic source level depending on the difference between the respective voltages from the source.

6. The converter of claim 5, wherein the logic source is an inverter.

7. The converter of claim 5, wherein the logic source comprises two emitter follower circuits and a resistor network, each coupled between electrical power and ground.

8. The converter of claim 7, wherein the emitter followers each comprises a bipolar junction transistor.

9. A switched-capacitor digital-to-analog converter comprising:
   a plurality of cells, each cell comprising first and second switches switching respective voltages from a source to a charged capacitor,
   respective switch driver circuits each in electrical communication with a respective one of the first and second switches, each switch driver circuit applying a switch control signal to the switch, the switch control signals that turn the switches on differing to equalize the on-state gate-to-source voltage differences of the first and second switches; and
   respective switches coupled between adjacent cells of the plurality of cells, the switches controllably connecting the cells ultimately producing an analog output corresponding to a digital input word.

10. A method for data conversion using a switched-capacitor digital-to-analog converter comprising the steps of:
   providing a plurality of cells, each cell comprising first and second switches switching respective different voltages from a source to a charged capacitor;
   providing respective switch driver circuits each in electrical communication with a respective one of the first and second switches;
   applying respective switch control signals to each of the first and second switches, the switch control signals that turn the switches on differing to equalize the on-state gate-to-source voltage differences of the first and second switches;
   receiving an external input, at a first element, the first element providing an output responsive to the received input; and
   receiving the output at a second element in electrical communication with the first element, and conditioning the output according to the difference between the respective voltages from the source.

11. The method of claim 10, wherein the first element is a logic gate receiving one bit of a digital input word and a switching control signal.

12. The method of claim 11, wherein the logic gate is a NAND gate.

13. The method of claim 11, wherein the switching control signal is a clock signal.

14. The method of claim 11, wherein the second element is a logic gate powered by a logic source level depending on the difference between the respective voltages from the source.

15. The method of claim 14, wherein the logic gate is an inverter.

16. A method for data conversion using a switched-capacitor digital-to-analog converter comprising the steps of:
   providing a plurality of cells, each cell comprising first and second switches switching respective different voltages from a source to a charged capacitor;
   providing respective switch driver circuits each in electrical communication with respective one of the first and second switches,
   applying respective switch control signals to each of the first and second switches, the switch control signals that turn the switches on differing to equalize the on-state gate-to-source voltage differences of the first and second switches; and
   providing respective switches coupled between adjacent cells of the plurality of cells, the switches controllably connecting the cells ultimately producing an analog output corresponding to a digital input word.

17. A switched-capacitor digital-to-analog converter comprising:
   a plurality of cells, each cell comprising first and second switches switching respective voltages from a source to a charged capacitor; and
   respective switch driver circuits, each in electrical communication with a respective one of the first and second switches, each switch driver circuit applying a switch control signal to the switch, the switch control signals that turn the switches on differing to equalize the on-state gate-to-source voltage differences of the first and second switches, each switch driver circuit including:
a first logic gate receiving as external input one bit of a digital input word and a switching control signal, the first logic gate providing an output responsive to the received input; and
a second logic gate in electrical communication with the first logic gate, the second logic gate receiving the output and conditioning the output according to the difference between the respective voltages from the source, the second logic gate being powered by a logic source level depending on the difference between the respective voltages from the source.

18. A method for data conversion using a switched-capacitor digital-to-analog converter comprising the steps of:
providing a plurality of cells, each cell comprising first and second switches switching respective different voltages from a source to a charged capacitor;
providing respective switch driver circuits each in electrical communication with a respective one of the first and second switches;
applying respective switch control signals to each of the first and second switches, the switch control signals that turn the switches on differing to equalize the on-state gate-to-source voltage differences of the first and second switches;
receiving at a first logic gate an external input of one bit of a digital input word and a switching control signal, the first logic gate providing an output responsive to the received input;
receiving the output at a second logic gate in electrical communication with the first logic gate; and
conditioning the output according to the difference between the respective voltages from the source.

* * * * *